(12) United States Patent
Hsu et al.

(10) Patent No.: US 11,398,814 B2
(45) Date of Patent: Jul. 26, 2022

(54) LOW-POWER SINGLE-EDGE TRIGGERED FLIP-FLOP, AND TIME BORROWING INTERNALLY STITCHED FLIP-FLOP

(71) Applicant: Intel Corporation, Santa Clara, CA (US)

(72) Inventors: Steven Hsu, Lake Oswego, OR (US); Amit Agarwal, Hillsboro, OR (US); Simeon Realov, Portland, OR (US); Satish Damaraju, El Dorado Hills, CA (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 229 days.

(21) Appl. No.: 16/813,558

(22) Filed: Mar. 9, 2020

(65) Prior Publication Data

US 2021/0281250 A1  Sep. 9, 2021

(51) Int. Cl.
*H03K 3/037* (2006.01)
*G06F 3/06* (2006.01)
*G06F 1/06* (2006.01)
*G01R 31/3177* (2006.01)

(52) U.S. Cl.
CPC ....... *H03K 3/0372* (2013.01); *G01R 31/3177* (2013.01); *G06F 1/06* (2013.01); *G06F 3/0604* (2013.01); *G06F 3/0659* (2013.01); *G06F 3/0673* (2013.01)

(58) Field of Classification Search
CPC .............. H03K 3/0372; H03K 3/037; H03K 3/356121; H03K 3/356156; H03K 3/012; G01R 31/3177; G06F 1/06; G06F 3/0604; G06F 3/0659; G06F 3/0673
See application file for complete search history.

(56) References Cited

U.S. PATENT DOCUMENTS

| | | | |
|---|---|---|---|
| 7,248,090 B2* | 7/2007 | Ramprasad | H03K 3/356 327/202 |
| 2006/0103443 A1* | 5/2006 | Rhee | H03K 3/35625 327/218 |
| 2009/0002044 A1* | 1/2009 | Kobayashi | H03K 3/35625 327/203 |
| 2017/0359054 A1* | 12/2017 | Hsu | H03K 19/0002 |
| 2018/0159513 A1* | 6/2018 | Reddy | H03K 3/35625 |
| 2021/0058073 A1* | 2/2021 | Wu | H03K 19/094 |

* cited by examiner

*Primary Examiner* — Ajay Ojha
(74) *Attorney, Agent, or Firm* — Schwabe, Williamson & Wyatt, P.C.

(57) ABSTRACT

A new family of shared clock single-edge triggered flip-flops that reduces a number of internal clock devices from 8 to 6 devices to reduce clock power. The static pass-gate master-slave flip-flop has no performance penalty compared to the flip-flops with 8 clock devices thus enabling significant power reduction. The flip-flop intelligently maintains the same polarity between the master and slave stages which enables the sharing of the master tristate and slave state feedback clock devices without risk of charge sharing across all combinations of clock and data toggling. Because of this, the state of the flip-flop remains undisturbed, and is robust across charge sharing noise. A multi-bit time borrowing internal stitched flip-flop is also described, which enables internal stitching of scan in a high performance time-borrowing flip-flop without incurring increase in layout area.

16 Claims, 8 Drawing Sheets

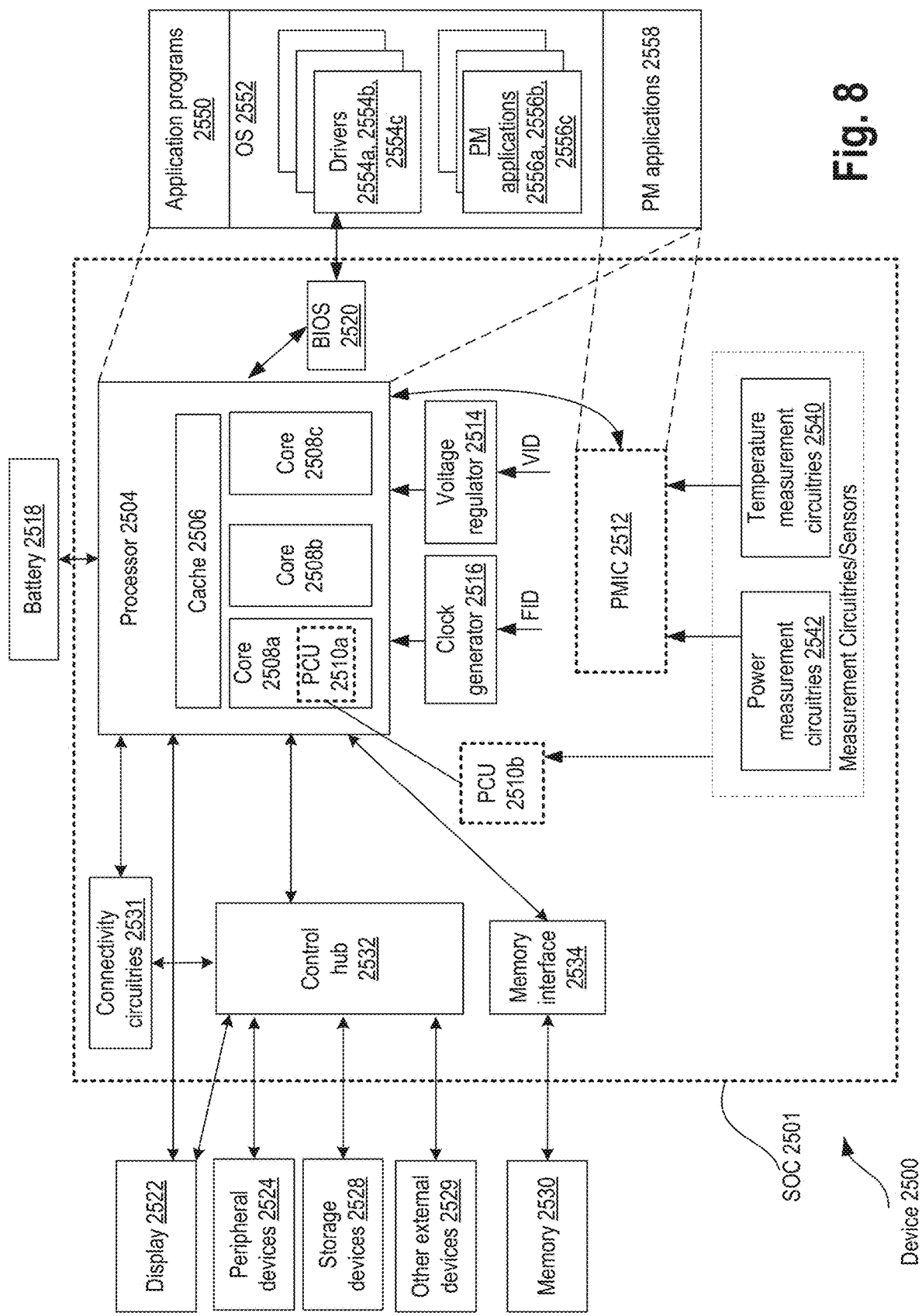

LOW-POWER SINGLE-EDGE TRIGGERED FLIP-FLOP, AND TIME BORROWING INTERNALLY STITCHED FLIP-FLOP

BACKGROUND

Clocking is one of the most significant power contributors and limiters for power-constrained server and/or mobile microprocessors and SoCs (system-on-chips), discrete and/or integrated graphics, AI (artificial intelligence) and/or special-purpose accelerators. Reducing power in systems with tight budgets improves performance by allowing integrating more cores, memory, or processing elements, and improves battery life for mobile and edge devices. Dynamic clocking power is the largest contributor and consumes up to, for example, 60% of the overall chip power dissipation, where most of the load is in the final flip-flops.

A flip-flop (FF) is a fundamental circuit used in all digital synchronous systems and must be very low power, since it contributes the most to the clocking power. Today's FFs already utilize minimum sized devices, and cannot be further downsized to reduce power. With process technology scaling, circuits are limited by variations to enable low-voltage operation for high energy-efficiency. This limits the smallest allowable device size preventing any further dynamic power savings though transistor sizing. Since performance, power, and area (PPA) benefits are slowing down as process technology scales (e.g., below the 7 nm process technology node), there is a need for new circuit innovations to improve PPA, specifically to reduce clocking power. In addition, with strong demand for higher frequency CPUs (central processing units), graphics, and artificial intelligence (AI) accelerators, deeper pipelines will exacerbate clocking power, increasing clock power further.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8 illustrates a smart device, or a computer system, or a SoC (System-on-Chip) with single-edge triggered FF with reduced shared clock pin capacitance and/or a time-borrowing internally stitched Octa FF, according to some embodiments of the disclosure.

DETAILED DESCRIPTION

Figure 1:
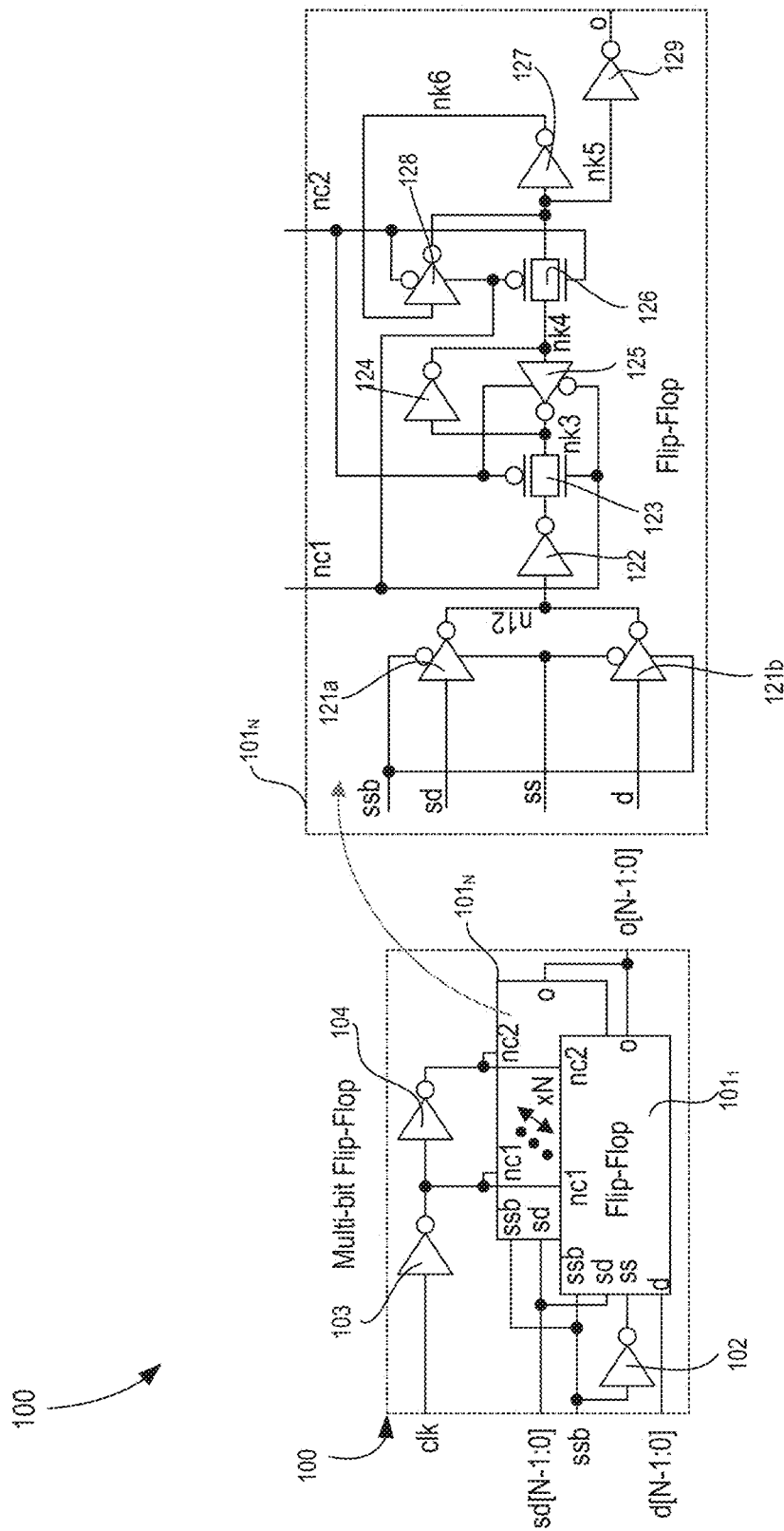
FIG. 1 illustrates a multi-bit transmission-gate flip-flop (FF) with data input multiplexer (Mux-D).

Multi-bit flip-flops have become the industry standard to reduce FF clocking power and have been integrated into many synthesis and automatic place and route (APR) tool flows. The concept involves grouping flip-flops in close physical proximity and combining them into a single standard cell with shared and down-sized local clock inverters. This reduces the local clock inverter power contribution and clock pin-cap, however, the internal clock devices per flip-flop remain eight. FF is a fundamental very high-usage circuit applied in all digital synchronous CPUs, GPUs, and AI accelerators and as frequencies continue to increase, clocking power will continue to increase as well.

Various embodiments disclose a new family of shared clock single-edge triggered flip-flops reducing the number of internal clock devices from 8 to 6 devices to reduce clock power. A static pass-gate master-slave flip-flop of some embodiments has no performance penalty compared to the flip-flops with 8 clock devices thus enabling significant power reduction. Reducing clock devices means less dynamic power consumption because clock devices switch between high and low conditions to propagate the clock.

Clock sharing cannot be performed arbitrarily within a conventional transmission gate flip-flop, however, the flip-flop of various embodiments intelligently maintains the same polarity between the master and slave stages which enables the sharing of the master tristate and slave state feedback clock devices without risk of charge sharing across all combinations of clock and data toggling. Because of this, the state of the flip-flop remains undisturbed, and is robust across charge sharing noise.

There are many technical effects of various embodiments. For example, the single-edge triggered flip-flop of various embodiments reduces the number of internal clock transistors from 8 to 6, further enabling clock power reduction beyond conventional multi-bit approaches. The FF of various embodiments demonstrates ISO-performance/ISO-area with, for example, 6% to 26% power savings across short and tall height libraries (e.g., 10 nm) and multi-bit configurations, which directly improves chip level power. Other technical effects will be evident from the various figures and embodiments.

As discussed herein, the single most important standard cell and fundamental building block of any digital integrated circuit is the flip-flop, which is required to store state in any sequential logic. Each latch or flip-flop must include testability circuit hooks (e.g., scan), which are used for testing (e.g., design for test cases). These testability circuit hooks consume significant area of a standard cell size of a latch or can be part of critical delay limiting frequency, therefore are a significant overhead. Also, it is common to combine latches or flip-flops into one multi-bit standard cell with shared local clock inverters to reduce power. These latches and flip-flops account for a large percentage of the area, therefore it is desirable to reduce flip-flop area due to the strong impact it has on the overall design.

Internal stitched multi-bit flip-flop takes advantage of the shared clock inverters to remove the unnecessary min-delay buffers, extra scan transistors, and push scan routing internal to the cell to reduce flip-flop cell area and reduce block level routing congestion. Time-borrowing flip-flops (TBFFs) are deployed in designs by using them as a means to fix outlier max delay paths, helping to bring those paths closer to the overall timing wall, while at the same time trying to keep the number of TBFFs inserted low and the associated dynamic power cost manageable.

TBFFs achieve this goal by opening up a transparency window between the master and slave latches, allowing a continuous trade-off between setup time and clock-to-out delay. Multi-bit TBFF design amortizes the clock power overhead needed to generate the internally skewed clock signals across the multiple bits, and leverages the internal white space to fit in the additional clock inverters needed without having to grow the overall cell area, enabling TBFF insertion during ECO (engineering change order) mode. Inherent hold time degradation requires redesigning of these TBFFs to be compatible in replacing internal-stitch multi-bit FFs, while preserving the area compatibility with conventional internal stitched flip-flop to enable their insertion during ECO mode. Here, ECO mode generally refers to an engineering change order mode where a designer propagates a request for change in a final design to fix or enhance a particular feature of the design.

Some embodiments, describe a multi-bit time borrowing internal stitched flip-flop, which enables internal stitching of scan in a high performance time-borrowing flip-flop without incurring increase in layout area. This high performance multi-bit flip-flop with ISO-cell-area is used as a means to fix outlier max delay paths, helping to bring those paths closer to overall timing walls during ECO mode, while at the same time keeping the associated power cost low. Time-borrowing internal stitched flip-flop fits into the same layout area as conventional flip-flop, which enables swapping these flip-flop after placement and route during ECO mode. Further, about 4.9 arbitrary units (a.u.) D-Q (data to output) delay gain can be used to fix outlier max delay paths. Other technical effects will be evident by the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a multi-bit transmission-gate flip-flop (FF) 100 with data input multiplexer (Mux-D). Multi-bit flip-flops have become the industry standard to reduce flip-flop clocking power and have been integrated into many synthesis and automatic place and route (APR) tool flows. Multi-bit FF 100 comprises a plurality of FFs 101$_{N-1}$, where 'N' is greater than one. Each FF of the plurality receives a scan select signal ssb (and its inverse ss). Inverter 102 generates the inverse of scan select bar, ss. Each FF of the plurality shares clock buffers or inverters 103 and 104 that provide clocks to nodes nc1 and nc2. Here, node names are interchangeably used with signal names. For example, clk may refer to node clk or clock signal depending on the context of the sentence. Each FF receives scan input and data input. For N number of FF, there are N number of scan inputs (e.g., sd[N−1:0]) and N number of data inputs (e.g., d[N−1:0]). The output 'o' of each FF can be merged in an N-bit bus (e.g., o[N−1:0]).

One such FF (e.g., 101$_N$) is shown in FIG. 1. FF 101$_N$ includes a scan input multiplexer to select one of scan input sd or data input d according to scan select signals ss and ssb. The multiplexer comprises two tristate inverters 121*a* and 121*b*. Inverter 122 receives output n12 from one of the two tristate inverters 121*a* and 121*b*. A master latch receives the output of inverter 122. The master latch comprises transmission pass-gate 123 and a memory element. The memory element comprises cross-coupled inverters-inverter 124 and tristate inverter 125. Clock nodes nc1 and nc2 control transmission gate 123. Clocks on nodes nc1 and nc2 control tristate inverter 125. Here, nodes nk3 and nk4 are state nodes of the master latch. Transmission gate 126 couples the master latch and slave latch. The memory element of the slave latch comprises inverter 127 and tristate inverter 128. The state nodes of the slave latch are nk5 and nk6. The state stored on node nk5 is output via inverter 129 to output node o.

The concept of multi-bit FF involves grouping flip-flops in close physical proximity and combining them into a single standard cell with shared and downsized local clock inverters. This reduces the local clock inverter power contribution and clock pin-cap, however, the internal clock devices per flip-flop remain 8 and all clock nodes nc1 and nc2 must be connected together with metal. Furthermore, to achieve low-voltage operation, the master feed-forward device 124 must be upsized (e.g., 2×) to prevent write-back failure. This sizing constraint increases the clock power due to the diffusion notch and/or may increase layout area.

Some disadvantages of the multi-bit flip-flop technique of FIG. 1 are that they increase the delay (worst-case black hole time) of the flip-flop, restrict placement (since they require flip-flops to be physically grouped and not placed in the optimal location), and merely reduces the clock power in the local clock inverters (e.g., may not reduce the number of clock transistors inside the flip-flop). The transmission gate flip-flop of FIG. 1 contains 8 clock devices and the multi-bit solution does not reduce this device capacitance. Since multi-bit flip-flops merely save power in the local clock inverters, there are diminishing returns as one creates a larger multi-bit cell due to the removal of local clock inverter device size underflow found in single-bit flip-flops.

Figure 2:
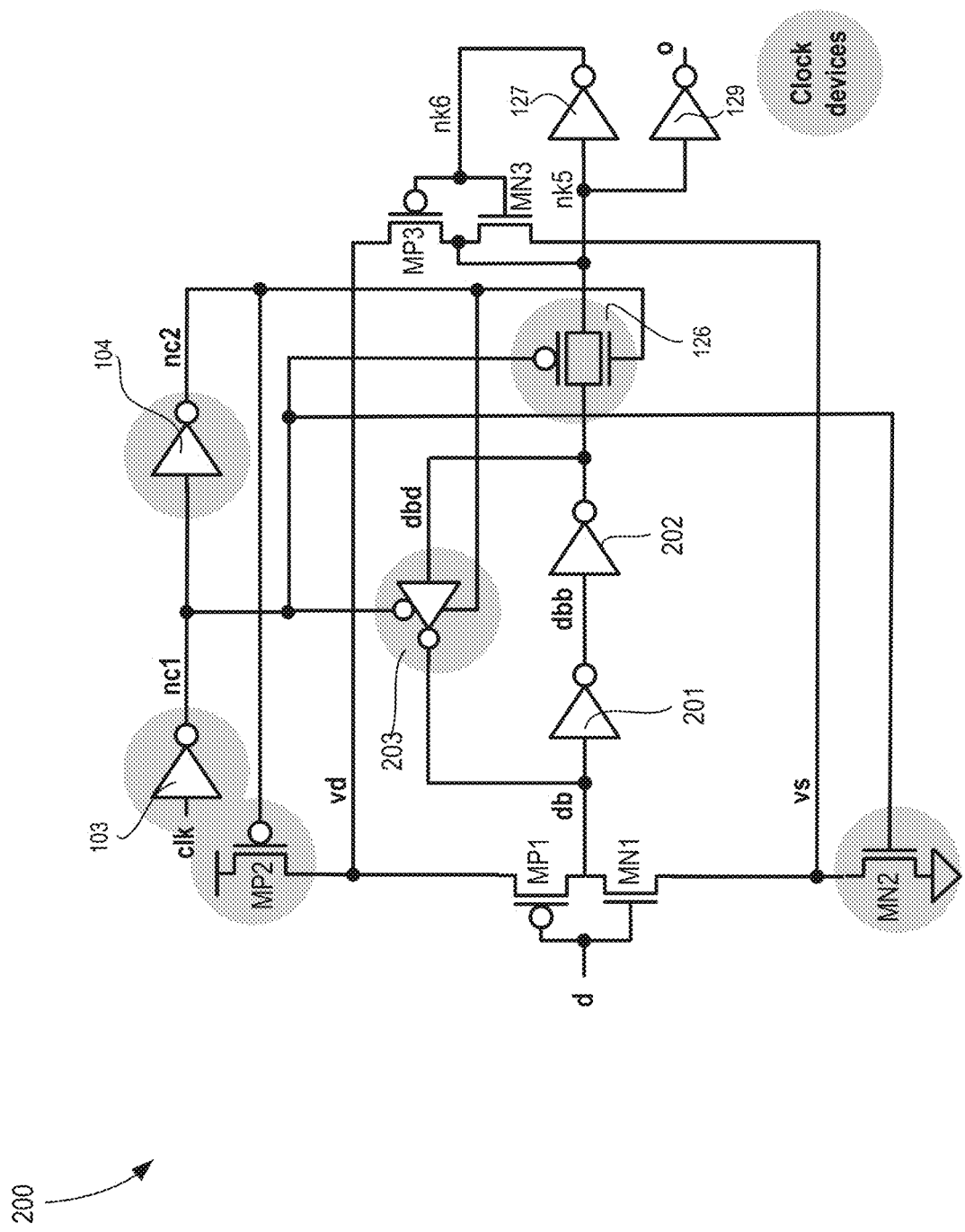
FIG. 2 illustrates a single-edge triggered FF with reduced shared clock pin capacitance, in accordance with some embodiments.

FIG. 2 illustrates a single-edge triggered FF 200 with reduced shared clock pin capacitance, in accordance with some embodiments. FF 200 comprises clock inverters 103 and 104 (like FIG. 1), inverters 201, 202, 127, and 129, pass-gates 126, tristate inverter 203, p-type transistors MP1, MP2, and MP3, n-type transistor MN1, MN2, MN3, and nodes nc1, nc2, d, db, dbb, dbd, nk5, nk6, and o coupled as shown.

FF 200 lowers the clock power of the flip-flop, which is the most dominate portion of the flip-flop power, since data 'd' activities have much lower toggle rates. Here, node names and signal names are interchangeably used. For example, 'd' may represent data signal or node depending on the context of the sentence. The shaded devices or gates are the clock devices. To reduce the clock power, FF 200 intelligently maintains the same polarity between the master and slave state nodes (db and nk5, respectively) to enable clock sharing (MP2 and MN2) between the master input tristate devices MP1 and MN1 and slave state feedback via transistors MP3 and MN3. In this topology there is zero or substantially zero risk of charge sharing across all combination of clock and data toggling. Nodes vd and vs are shared internal stack nodes and the circuit operates logically equivalent prior to sharing clock devices.

FF 200 comprises a first n-type transistor MN1 to receive data input 'd' and a second n-type transistor MN2 coupled in series with the first n-type transistor MN1, wherein the second n-type transistor MN2 is controllable by a first clock nc1. FF 200 further comprises a first p-type transistor MP1 to receive the data input 'd', wherein the first p-type transistor MP1 is coupled in series to the first n-type transistor MN1. FF 200 further comprises a second p-type transistor MP2 coupled in series to the first p-type transistor MP1, wherein the second p-type transistor MP1 is controllable by a second clock nc2. Here, the first clock nc1 is an inverse of the second clock nc2, or put it differently, nc1 is an inverse of clk while nc2 and clk have the same polarity. In various embodiments, drain terminals of the second n-type transistor MN2 and the second p-type transistor MP1 are coupled to a slave stage of the flip-flop. A person skilled in the art would appreciate that a FF includes a slave stage and a master stage.

In some embodiments, the master stage of FF 200 includes a first inverter 201 coupled to drain terminals of the first n-type transistor MN1 and the first p-type transistor MP1. The master stage also includes second inverter 202 coupled to first inverter 201. In some embodiments, the master stage includes tristate inverter 203 coupled to an output of second inverter 202 and the drain terminals of the first n-type transistor MN1 and the first p-type transistor MP1. The tristate inverter 203 is controllable by the first and second clocks nc1 and nc2, respectively.

In some embodiments, FF 200 comprises a pass-gate 126 coupled to the output of second inverter 202, wherein pass-gate 126 is controllable by the first and second clocks nc1 and nc2, respectively. In various embodiments, pass-gate 126 couples the master stage with the slave stage. In some embodiments, the slave stage comprises a third inverter 127 coupled (via node nk5) to pass-gate 126. The slave stage further includes a third n-type transistor MN3 having a gate terminal coupled to an output (node nk6) of third inverter 127, wherein a source terminal of the third n-type transistor is coupled to the drain terminal vs of the second n-type transistor MN2. The slave stage also includes a third p-type transistor MP3 having a gate terminal coupled to the output of third inverter 127, wherein a source terminal of the third p-type transistor MP3 is coupled to the drain terminal vd of the second p-type transistor MP2. The drain terminals of the third n-type transistor MN3 and third p-type transistor MP3 are coupled to an input of third inverter 127 and pass-gate 126. The output of FF 200 is driven by a fourth inverter 129 coupled to the input nk5 of the third inverter 127 and pass-gate 126. The two clocks nc1 and nc2 are generated by a fifth inverter 103 and a sixth inverter 104. The fifth inverter 103 receives an input clock clk and generates the first clock nc1 while the sixth inverter 104 couples to fifth inverter 103. The sixth inverter 104 receives the first clock nc1 and generates the second clock nc2.

The clock sharing enables a reduced number of internal clock devices from 8 to 6 compared to a transmission-gate flip-flop 100. The reduced number of clock devices directly translates to cell and chip-level power reduction. FF 200 has a full tristate feedback (via tristate inverter 203) for the master state node dbd. As such, FF 200 is free from write-back failures, since the master state node is completely isolated from the slave.

Figure 3:
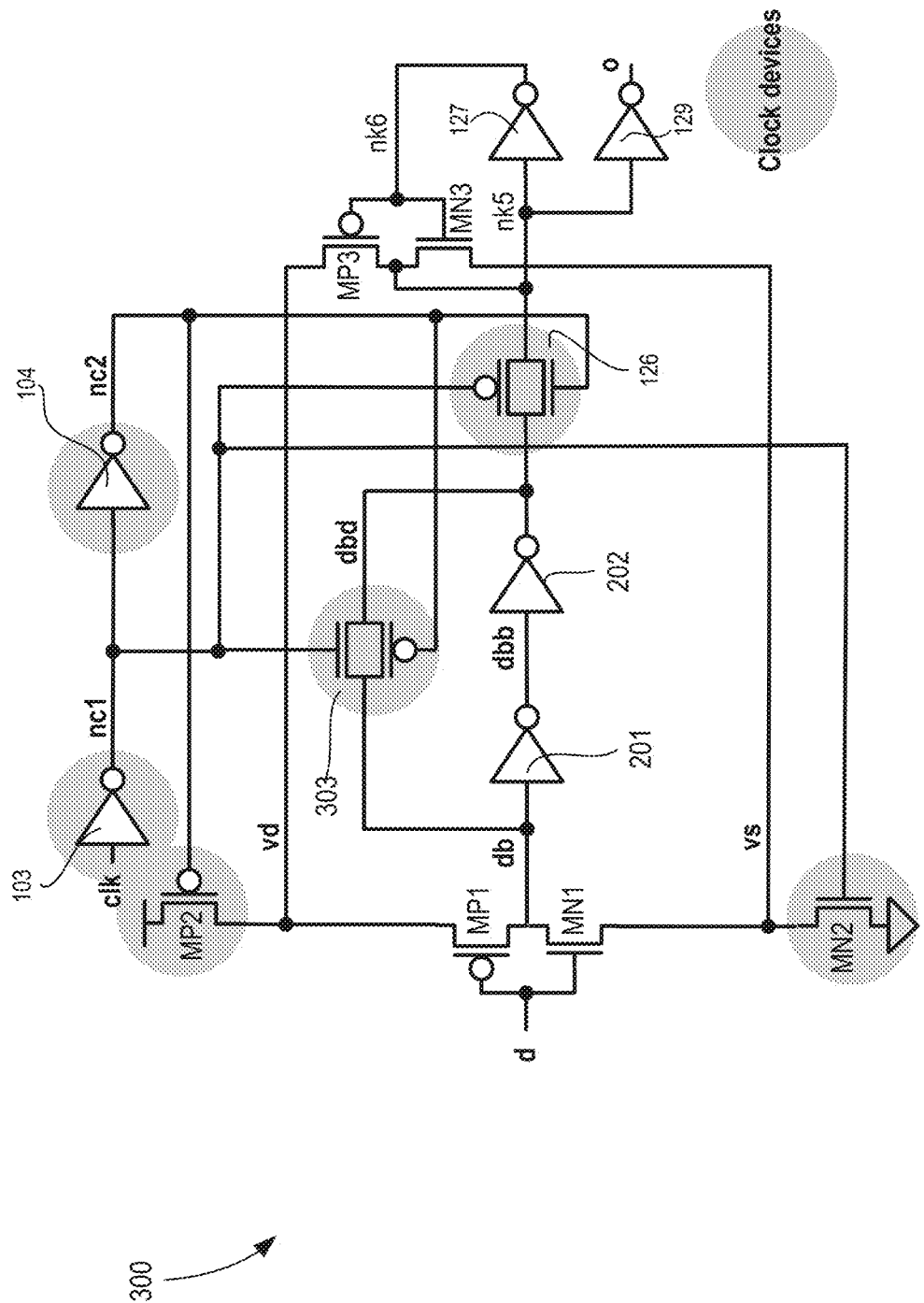
FIG. 3 illustrates a single-edge triggered FF with reduced shared clock pin capacitance, in accordance with some embodiments.

FIG. 3 illustrates a single-edge triggered FF 300 with reduced shared clock pin capacitance, in accordance with some embodiments. In FF 300, the master stage comprises first inverter 201 coupled to drain terminals of the first n-type transistor MN1 and the first p-type transistor MP1. The master stage also includes a second inverter 202 coupled to the first inverter 201. In some embodiments, the master stage includes tristate inverter 303 coupled to an output of second inverter 202 and the drain terminals of the first n-type transistor MN1 and the first p-type transistor MP1. Tristate inverter 303 is controllable by the first and second clocks nc1 and nc2, respectively. FF 300 is an alternate version which uses a tristate inverter 303 feedback for the master state node, increasing the flip-flop device count by 2. However, since the master state node is exposed to the slave, the cell is sized correctly to prevent write-back.

Figure 4:
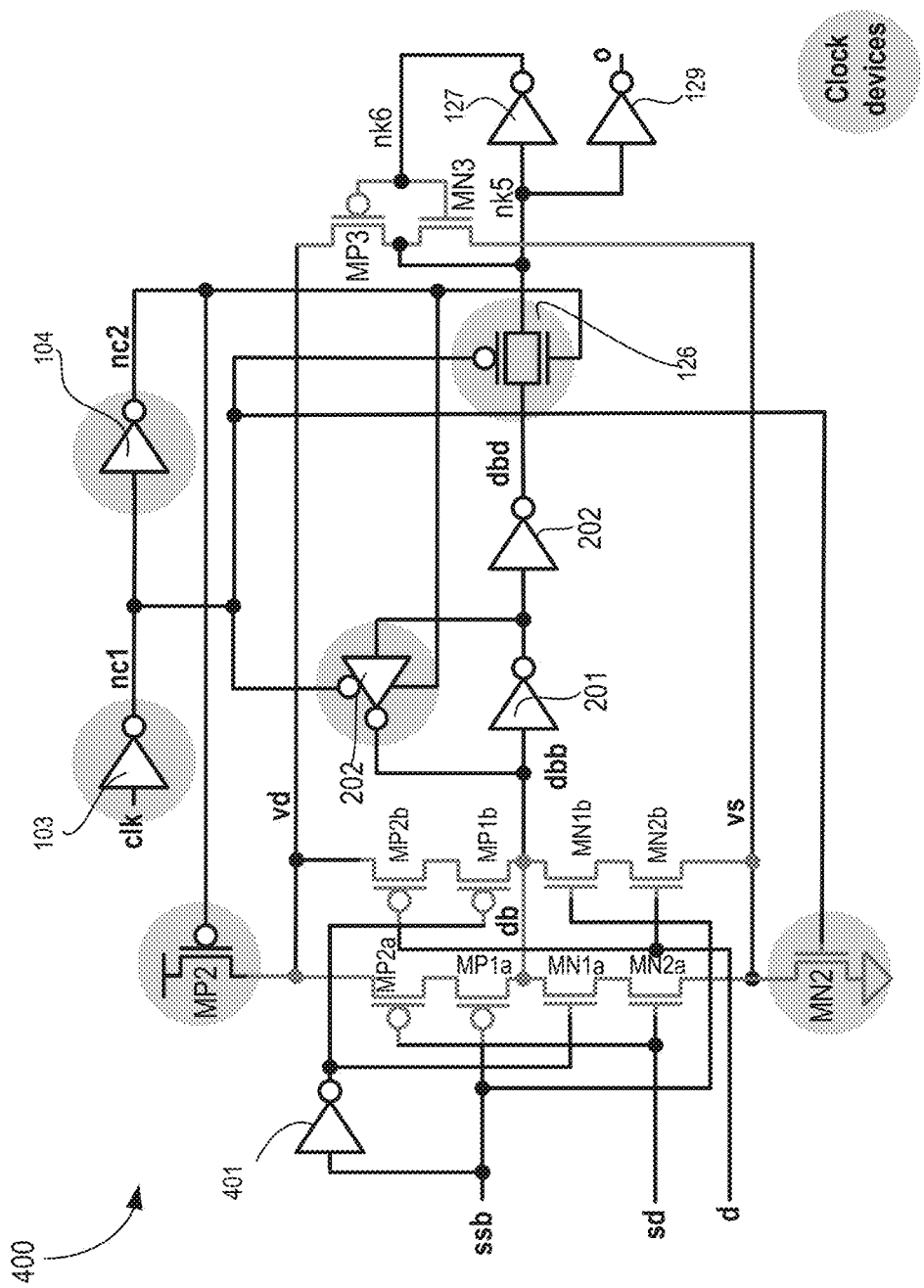
FIG. 4 illustrates a single-edge triggered FF with reduced shared clock pin capacitance and with multiplexer based scan, in accordance with some embodiments.

FIG. 4 illustrates a single-edge triggered FF 400 with reduced shared clock pin capacitance and with multiplexer based scan, in accordance with some embodiments. Compared to FIG. 2, here scan capability is added to FF 400. The scan multiplexer comprises inverter 401, p-type transistors MP2a, MP1a, MP2b, and MP1b, n-type transistors MN1a, MN2a, MN1b, and MN2b, scan data input sd, and scan control ssb coupled as shown. Scan input sd is received by transistors MP2a and MN2a. Data input d is received by MP2b and MN2b. When scan input sd is selected, transistors MP1a and MN1a are on while MP1b and MN1b are off. When regular data d is selected, transistors MP1a and MN1a are off while MP1b and MN1b are on.

Figure 5:
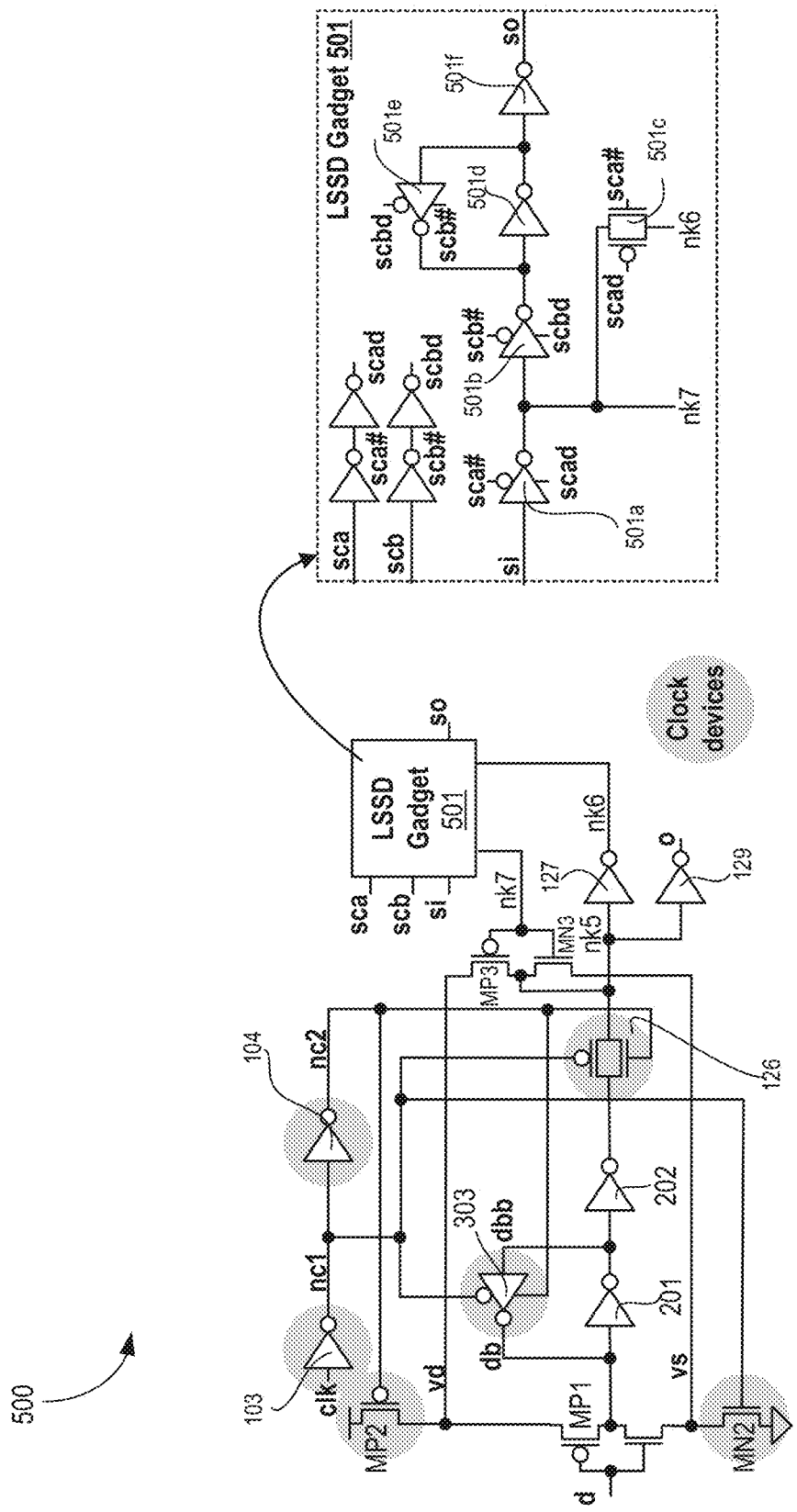
FIG. 5 illustrates a single-edge triggered FF with reduced shared clock pin capacitance and with level-sensitive scan gadget, in accordance with some embodiments.

FIG. 5 illustrates a single-edge triggered FF 500 with reduced shared clock pin capacitance and with level-sensitive scan gadget (LSSD), in accordance with some embodiments. FF 500 is same as FF 200 but for an LSSD gadget 501 between nodes nk6 and nk7. LSSD gadget 501 comprises scan control signals sca and scb, scan input si, scan output so, scan control inverters that generate sca # (inverse of sca), scad (buffered version of sca), scb # (inverse of scb) and scbd (buffered version of scb). Gadget 501 further includes tristate inverters 501a, 501b, 501e, inverters 501d and 501f, and pass-gate 501c. Node nk7 is coupled to the output of tristate inverter 501a. Node nk6 is coupled to pass-gate 501c.

Both scan methodologies of FIG. 4 and FIG. 5 are used widely across CPU (central processing unit), GPU (graphics processing unit), and AI (artificial intelligence) accelerators. Furthermore, the FFs of various embodiments are fully compatible with existing multi-bit flip-flop techniques, falling-edge triggered designs, and set/reset configurations and is able to reduce the power beyond the state-of-the-art multi-bit techniques. For example, vectored flip-flop with or without scan can be implemented using the FFs of various embodiments. Further, time borrowing flip-flops with additional clock delay stages can also be incorporated in the FFs of various embodiments.

Detailed performance, power, and area (PPA) simulation comparisons are presented using 10 nm tall and short height standard cell libraries in Table 1.

TABLE 1

| FF type | Configuration | Standard cell height | Performance (worst-case Tsetup + Tclktoq) | Power $\alpha_{Data} = 10\%$ | Area |
|---|---|---|---|---|---|
| FIG. 1 | Single-bit | Tall | 1.0 | 1.0 | 1.0 |
| FIG. 2 | Single-bit | Tall | 0.99 | 0.83 | 1.0 |
| FIG. 1 | Duo-bit | Tall | 1.0 | 1.0 | 1.0 |
| FIG. 2 | Duo-bit | Tall | 1.04 | 0.74 | 1.0 |
| FIG. 1 | Quad-bit | Tall | 1.0 | 1.0 | 1.0 |
| FIG. 2 | Quad-bit | Tall | 0.99 | 0.87 | 1.0 |
| FIG. 1 | Single-bit | Short | 1.0 | 1.0 | 1.0 |
| FIG. 2 | Single-bit | Short | 1.04 | 0.88 | 1.2 |
| FIG. 1 | Octa-bit | Short | 1.0 | 1.0 | 1.0 |
| FIG. 2 | Octa-bit | Short | 0.99 | 0.94 | 1.0 |

The circuit of various embodiments demonstrate ISO-performance/ISO-area with 6% to 26% power savings at typical, 0.65V, 100° C. Short and tall height libraries have different internal metal resources and while the embodiments benefit both, FFs of various embodiments provide better PPA benefits for tall height libraries. For high-frequency chips with many flip-flops, total chip-level power can be up to 60%, where 30% is due to the flip-flops. Based on these estimates, the FFs of various embodiments can save approximately 1% to 3% total chip level power, depending on flip-flop usage.

Figure 6:
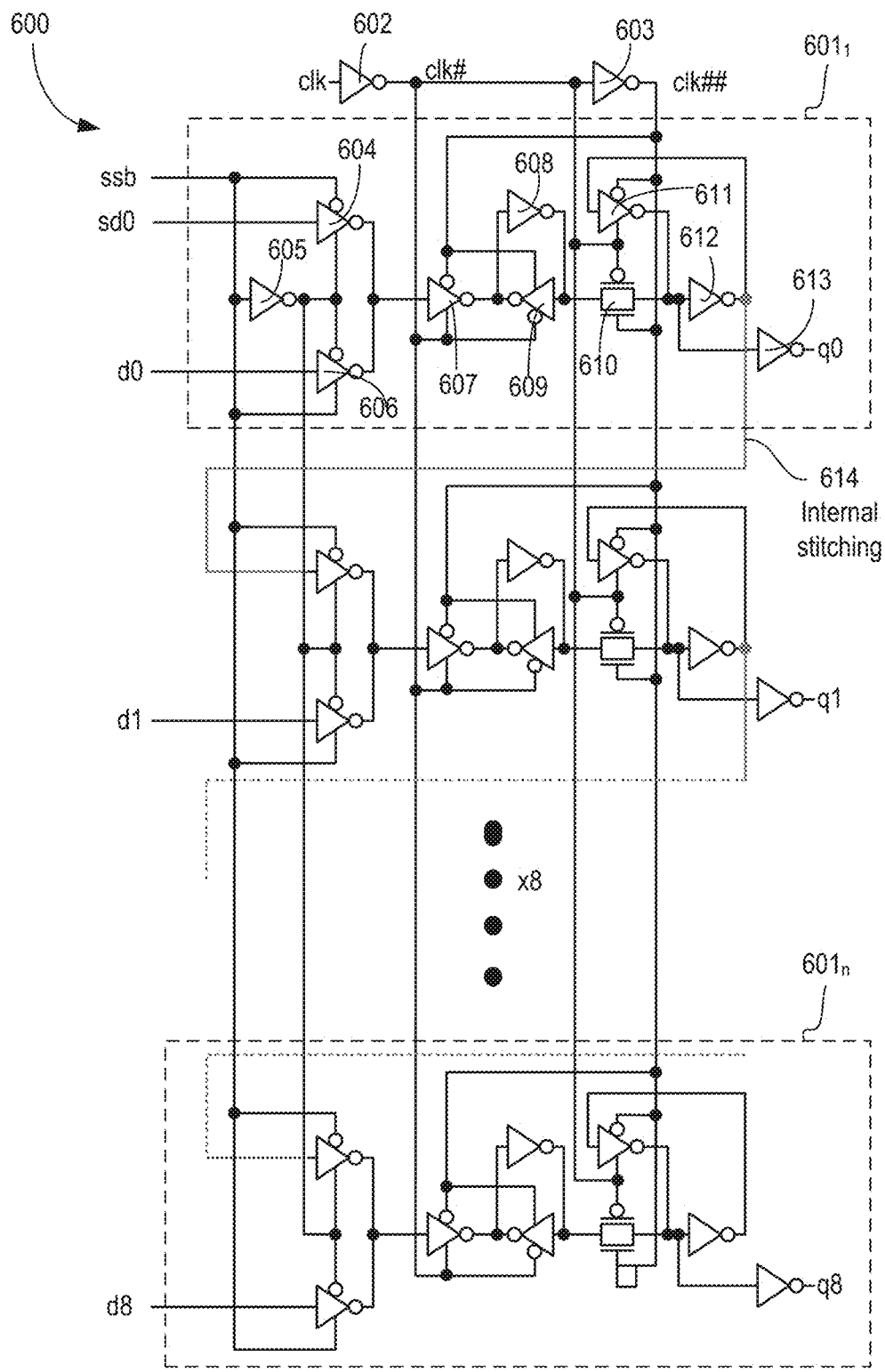
FIG. 6 illustrates an internally stitched Octa FF, in accordance with some embodiments.

FIG. 6 illustrates an internally stitched Octa FF 600, in accordance with some embodiments. In this example, FF 600 comprises 8 FF cells labeled $601_1$ though $601_n$ where n=8. The 8 FF cells share clock inverters 602 and 603 that generate clock # (inverse of clk) and clk ## (same polarity as clk) for the 8 FF cells. Each FF cell (e.g., $601_1$) includes a scan multiplexer that comprises tristate inverters 604 and 606, and inverter 605. Scan control ssb selects between scan data sd0 or data d0. Each FF cell receives its down data. For example, cell $601_1$ receives d0, cell $601_2$ receives d1, and cell $601_8$ receives d8. FF $600_1$ includes a master stage comprising tristate inverters 607 and 609 and inverter 608. The master stage is coupled to a slave stage via pass-gate 610. The slave stage comprises inverter 612 and tristate inverter 611. The output (e.g., q0) of each FF cell is driven by its output inverter 613. The slave node, which is the output of inverter 612, is coupled to inverter 604 of the next FF cell via internal stitching node 614. The internal stitched multi-bit FF 600 takes advantage of the shared clock inverters 602 and 603 to remove the unnecessary min-delay buffers, extra scan transistors, and push scan routing internal to the cell to reduce flip-flop cell area and reduce block level routing congestion.

Figure 7:
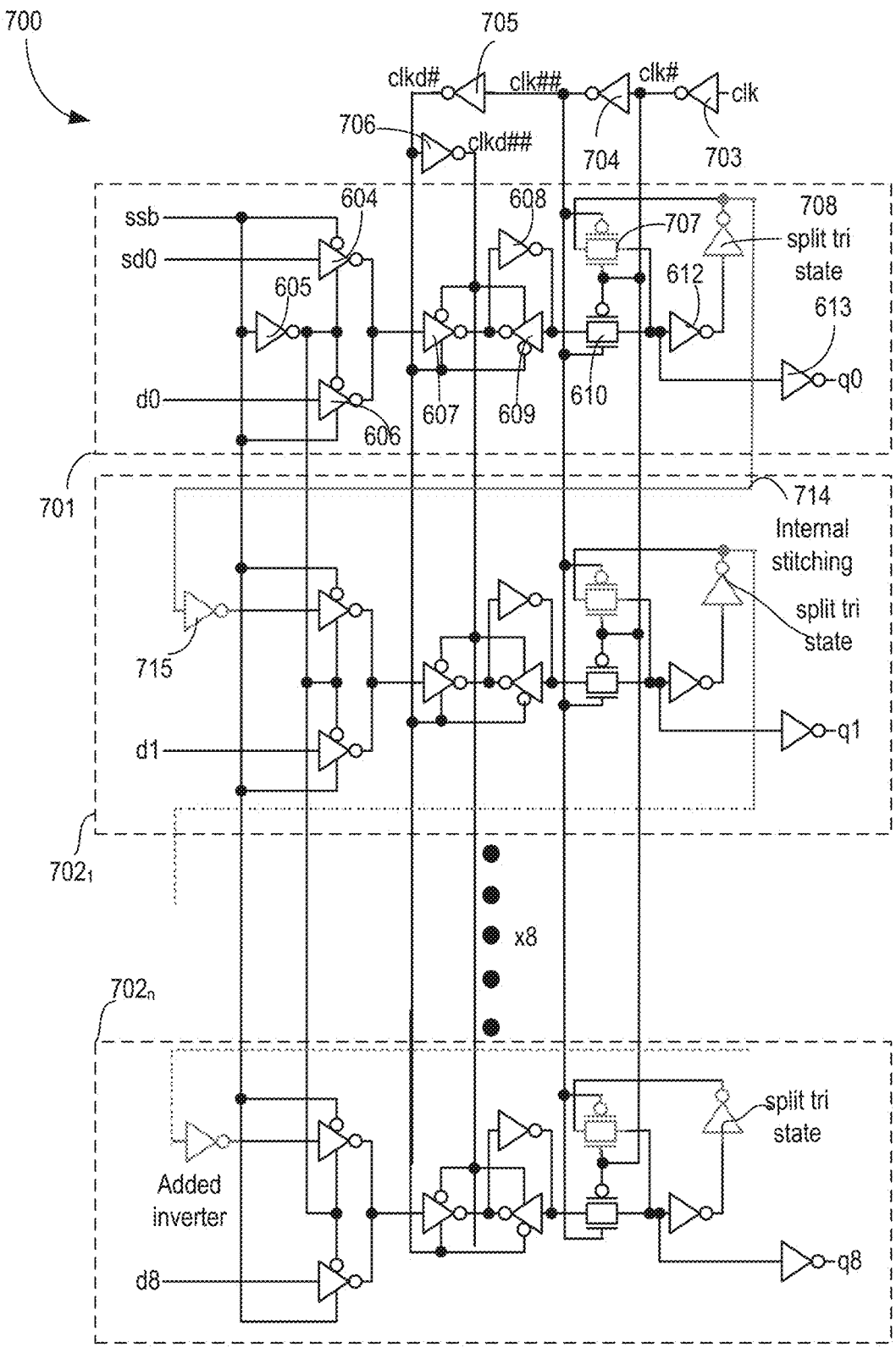
FIG. 7 illustrates a time borrowing internally stitched Octa FF, in accordance with some embodiments.

FIG. 7 illustrates a time borrowing internally stitched Octa FF 700, in accordance with some embodiments. In this example, FF 700 comprises 8 FF cells labeled 701 and $702_1$ though $702_n$ where n=8. However, 'n' can be any number. The 8 FF cells share clock inverters 703, 704, 705, and 706 that generate clk # (inverse of clk) and clk ## (same polarity as clk), clkd # (delayed but inverse of clk) and clkd ## (delayed but same as clk) for the 8 FF cells. FF cell 701 comprises scan multiplexer that comprises tristate inverters 604 and 606, and inverter 605. Scan control ssb selects between scan data sd0 or data d0.

Time borrowing flip-flop inherently have larger hold time delays because master clock is delayed with respect to slave stage to achieve time-borrowing. Due to this large hold time, internal stitching of scan uses a hold-time min-delay buffer insertion at scan input. FF 700 splits the slave stage tristate keeper or inverter 611 to inverter pass gate (707 and 708)

and connects the inverter output 714 (e.g., output of inverter 708) to the scan input of the next bit. This splitting adds an inverter 708 between scan input and output for free without incurring any area overhead.

To insert a full buffer between scan input/output and to keep the polarity even, an additional inverter 715 is added at internal scan inputs. These inverters 708 and 715 are folded into the white space available in multi-bit flip-flop layout without incurring any area overhead. This new FF design of FIG. 7 results in five data inverters between slave and next bit master transmission gate to compensate 3 clock inverter difference between their clocks. The extra two inverters help to compensate the internal scan hold time overhead due to time-borrowing. The time borrowing internal stitched flip-flop design fits into same layout footprint as conventional flip-flop enabling their insertion during ECO mode. The topology shows no failure in the internal min-delay variation simulations across all process corners, low to high supply voltages, low-to-high temperatures, and systematic/random process variation.

Table 2 and Table 3 compares delay and power simulation results of octa flip-flop 600 and time borrowing internal stitched flip-flop 700.

TABLE 2

| | Rise-to-rise (ps) | | | | | Fall-to-Fall (ps) | | | | | Worst Case | | |
|---|---|---|---|---|---|---|---|---|---|---|---|---|---|
| | Max | Min | | | | Max | Min | | | | | | |
| FF | Setup | Clk2Q | Hold | D-Q | TW | Setup | Clk2Q | Hold | D-Q | TW | setup | ClktoQ | D-Q |
| 600 | 1 | 8.8 | 0.3 | 9.8 | 0 | 4.6 | 6.2 | −2.9 | 10.8 | 0 | 4.6 | 8.8 | 13.4 |
| 700 | −0.9 | 7.3 | 4.4 | 6.4 (+3.4) | 2.3 | 1.2 | 6.4 | 2.3 | 7.6 (+3.1) | 2.4 | 1.2 | 7.3 | 8.5 (+4.9) |

TABLE 3

| | Power | | |
|---|---|---|---|
| FF | 0% Data Activity | 25% Data Activity | 100% Data Activity |
| 600 | 0 | 0 | 0 |
| 700 | +34% | +29% | +24% |

Table 2 shows a summary of the Clk2Q (clock-to-output), setup, hold, D-Q (data-to-output) and TW (time-borrowing window) delay in arbitrary units (au) for both rising edge and falling edge of the clock. Same process technology node, temperature, and supply voltage is used for all cases.

Flip-flop 700 results in 4.9 au (arbitrary unit) better worst case D-Q delay (data-to-output) compared to flip-flop 600. Sharing of added local clock inverters across eight flip-flops results in 24%-34% power overhead across 0%-100% data activity as indicated by Table 3. The improvement in D-Q with ISO-cell-area enables time borrowing internal stitched flip-flop to use as a means to fix outlier maximum delay paths, helping to bring those paths closer to overall timing walls during ECO mode, while at the same time keeping the associated power cost low.

FIG. 8 illustrates a smart device, or a computer system, or an SoC (System-on-Chip) having single-edge triggered flip-flop with reduced shared clock pin capacitance and/or a time-borrowing internally stitched Octa FF (e.g., FF 700), according to some embodiments of the disclosure. In some embodiments, device 2500 represents an appropriate computing device, such as a computing tablet, a mobile phone or smart-phone, a laptop, a desktop, an Internet-of-Things (JOT) device, a server, a wearable device, a set-top box, a wireless-enabled e-reader, or the like. It will be understood that certain components are shown generally, and not all components of such a device are shown in device 2500. Any components here can have the single-edge triggered flip-flop with reduced shared clock pin capacitance and/or a time-borrowing internally stitched Octa flip-flop.

In an example, the device 2500 comprises a SoC (System-on-Chip) 2501. An example boundary of the SOC 2501 is illustrated using dotted lines in FIG. 8, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 are shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions are fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508a, 2508b, 2508c, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510*a*. In an example, some other sections of PCU 2510 may be implemented outside the processing cores 2508, and these sections of PCU 2510 are symbolically illustrated using a dotted box and labelled as PCU 2510*b*. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556*a*, 2556*b*, 2556*c*. The OS 2552 may also include various drivers 2554*a*, 2554*b*, 2554*c*, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1: A flip-flop comprising: a first n-type transistor to receive a data input; a second n-type transistor coupled in series with the first n-type transistor, wherein the second n-type transistor is controllable by a first clock; a first p-type transistor to receive the data input, wherein the first p-type transistor is coupled in series to the first n-type transistor; a second p-type transistor coupled in series to the first p-type transistor, wherein the second p-type transistor is controllable by a second clock, wherein the first clock is an inverse of the second clock, and wherein drain terminals of the second n-type transistor and the second p-type transistor are coupled to a slave stage of the flip-flop.

Example 2: The flip-flop of claim 1 comprising a master stage which includes: a first inverter coupled to drain terminals of the first n-type transistor and the first p-type transistor; a second inverter coupled to the first inverter; and a tristate inverter coupled to an output of the second inverter and the drain terminals of the first n-type transistor and the first p-type transistor, wherein the tristate inverter is controllable by the first and second clocks.

Example 3: The flip-flop of claim 1 comprising a master stage which includes: a first inverter coupled to drain terminals of the first n-type transistor and the first p-type transistor; a second inverter couples to the first inverter; and a pass-gate coupled to an output of the second inverter and the drain terminals of the first n-type transistor and the first p-type transistor, wherein the pass-gate is controllable by the first and second clocks.

Example 4: The flip-flop of claim 2 comprising a pass-gate coupled to the output of the second inverter, wherein the pass-gate is controllable by the first and second clocks.

Example 5: The flip-flop of claim 4, wherein the slave stage comprises: a third inverter coupled to the pass-gate; and a third n-type transistor having a gate terminal coupled to an output of the third inverter, wherein a source terminal of the third n-type transistor is coupled to the drain terminal of the second n-type transistor.

Example 6: The flip-flop of claim 5, wherein the slave stage comprises: a third p-type transistor having a gate terminal coupled to the output of the third inverter, wherein a source terminal of the third p-type transistor is coupled to the drain terminal of the second p-type transistor, wherein drain terminals of the third n-type transistor and the third p-type transistor are coupled to an input of the third inverter and the pass-gate.

Example 7: The flip-flop of claim 6 comprises a fourth inverter coupled to the input of the third inverter and the pass-gate.

Example 8: The flip-flop of claim 1 comprises: a fifth inverter to receive an input clock and to generate the first clock; and a sixth inverter couples to the fifth inverter, wherein the sixth inverter is to receive the first clock and to generate the second clock.

Example 9: A flip-flop comprising: a first inverter to receive an input clock; a second inverter coupled to the first inverter, wherein the first inverter is to generate a first clock, and wherein the second inverter is to generate a second clock, wherein the second clock is an inverse of the first clock; a master stage to receive the first and second clocks; a slave stage coupled to the master stage; and a pass-gate coupled to the master and slave stages, wherein the pass-gate is controllable by the first and second clocks, wherein a number of clock devices including the first and second inverters is six.

Example 10: The flip-flop of claim 9, comprising: a first n-type transistor to receive a data input; a second n-type transistor coupled in series with the first n-type transistor, wherein the second n-type transistor is controllable by a first clock; a first p-type transistor to receive the data input, wherein the first p-type transistor is coupled in series to the first n-type transistor; a second p-type transistor coupled in series to the first p-type transistor, wherein the second p-type transistor is controllable by the second clock, wherein the first clock is an inverse of the second clock, and wherein drain terminals of the second n-type transistor and the second p-type transistor are coupled to the slave stage of the flip-flop.

Example 11: The flip-flop of claim 10, wherein the master stage includes: a first inverter coupled to drain terminals of the first n-type transistor and the first p-type transistor; a second inverter couples to the first inverter; and a tristate inverter coupled to an output of the second inverter and the drain terminals of the first n-type transistor and the first p-type transistor, wherein the tristate inverter is controllable by the first and second clocks.

Example 12: The flip-flop of claim 10 wherein the master stage includes: a first inverter coupled to drain terminals of the first n-type transistor and the first p-type transistor; a second inverter couples to the first inverter; and a pass-gate coupled to an output of the second inverter and the drain terminals of the first n-type transistor and the first p-type transistor, wherein the pass-gate is controllable by the first and second clocks.

Example 13: The flip-flop of claim 11, wherein the slave stage comprises: a third inverter coupled to the pass-gate; and a third n-type transistor having a gate terminal coupled to an output of the third inverter, wherein a source terminal of the third n-type transistor is coupled to the drain terminal of the second n-type transistor.

Example 14: The flip-flop of claim 5, wherein the slave stage comprises: a third p-type transistor having a gate terminal coupled to the output of the third inverter, wherein a source terminal of the third p-type transistor is coupled to the drain terminal of the second p-type transistor, wherein drain terminals of the third n-type transistor and the third p-type transistor are coupled to an input of the third inverter and the pass-gate.

Example 15: The flip-flop of claim 13 comprises a fourth inverter coupled to the input of the third inverter and the pass-gate.

Example 16: A system comprising: a memory; a processor coupled to the memory, wherein the processor includes a flip-flop which comprises: a first n-type transistor to receive a data input; a second n-type transistor coupled in series with the first n-type transistor, wherein the second n-type transistor is controllable by a first clock; a first p-type transistor to receive the data input, wherein the first p-type transistor is coupled in series to the first n-type transistor; and a second p-type transistor coupled in series to the first p-type transistor, wherein the second p-type transistor is controllable by a second clock, wherein the first clock is an inverse of the second clock, and wherein drain terminals of the second n-type transistor and the second p-type transistor are coupled to a slave stage of the flip-flop; and a wireless interface to allow the processor to communicate with another device.

Example 17: The system of claim 16, wherein the flip-flop is a vectored flip-flop.

Example 18: The system of claim 16, wherein the flip-flop includes a scan multiplexer that multiplexes between the data input and a scan input.

Example 19: The system of claim 16, wherein the slave stage is coupled to a level sensitive scan design (LSSD) circuitry.

Example 20: The system of claim 16, wherein the FF comprises a master stage which includes: a first inverter coupled to drain terminals of the first n-type transistor and the first p-type transistor; a second inverter couples to the first inverter; and a pass-gate coupled to an output of the second inverter and the drain terminals of the first n-type transistor and the first p-type transistor, wherein the pass-gate is controllable by the first and second clocks.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A flip-flop comprising:
   a first n-type transistor to receive a data input;
   a second n-type transistor coupled in series with the first n-type transistor, wherein the second n-type transistor is controllable by a first clock;
   a first p-type transistor to receive the data input, wherein the first p-type transistor is coupled in series to the first n-type transistor;
   a second p-type transistor coupled in series to the first p-type transistor, wherein the second p-type transistor is controllable by a second clock, wherein the first clock is an inverse of the second clock, and wherein drain terminals of the second n-type transistor and the second p-type transistor are coupled to a secondary stage of the flip-flop; and
   a primary stage that includes:
      a first inverter coupled to drain terminals of the first n-type transistor and the first p-type transistor;
      a second inverter coupled to the first inverter; and
      a tristate inverter coupled to an output of the second inverter and the drain terminals of the first n-type transistor and the first p-type transistor, wherein the tristate inverter is controllable by the first and second clocks.

2. The flip-flop of claim 1, further comprising a pass-gate coupled to the output of the second inverter, wherein the pass-gate is controllable by the first and second clocks.

3. The flip-flop of claim 2, wherein the secondary stage comprises:
   a third inverter coupled to the pass-gate; and
   a third n-type transistor having a gate terminal coupled to an output of the third inverter, wherein a source terminal of the third n-type transistor is coupled to the drain terminal of the second n-type transistor.

4. The flip-flop of claim 3, wherein the secondary stage further comprises:
   a third p-type transistor having a gate terminal coupled to the output of the third inverter, wherein a source terminal of the third p-type transistor is coupled to the drain terminal of the second p-type transistor, wherein drain terminals of the third n-type transistor and the third p-type transistor are coupled to an input of the third inverter and the pass-gate.

5. The flip-flop of claim 4, further comprising a fourth inverter coupled to the input of the third inverter and the pass-gate.

6. The flip-flop of claim 1, further comprising:
   a fifth inverter to receive an input clock and to generate the first clock; and
   a sixth inverter coupled to the fifth inverter, wherein the sixth inverter is to receive the first clock and to generate the second clock.

7. A flip-flop comprising:
   a first n-type transistor to receive a data input;
   a first p-type transistor to receive the data input, wherein the first p-type transistor is coupled in series to the first n-type transistor;
   a first inverter to receive an input clock, wherein the first inverter is coupled to drain terminals of the first n-type transistor and the first p-type transistor;
   a second inverter coupled to the first inverter, wherein the first inverter is to generate a first clock, and wherein the second inverter is to generate a second clock, wherein the second clock is an inverse of the first clock;
   a primary stage to receive the first and second clocks, wherein the primary stage includes a tristate inverter coupled to an output of the second inverter and the drain terminals of the first n-type transistor and the first p-type transistor, wherein the tristate inverter is controllable by the first and second clocks;

a secondary stage coupled to the master stage; and a pass-gate coupled to the primary and secondary stages, wherein the pass-gate is controllable by the first and second clocks, wherein a number of clock devices including the first and second inverters is six.

8. The flip-flop of claim 7, further comprising:

a second n-type transistor coupled in series with the first n-type transistor, wherein the second n-type transistor is controllable by the first clock; and a second p-type transistor coupled in series to the first p-type transistor, wherein the second p-type transistor is controllable by the second clock, and wherein drain terminals of the second n-type transistor and the second p-type transistor are coupled to the secondary stage of the flip-flop.

9. The flip-flop of claim 7, wherein the secondary stage comprises:

a third inverter coupled to the pass-gate; and a third n-type transistor having a gate terminal coupled to an output of the third inverter, wherein a source terminal of the third n-type transistor is coupled to the drain terminal of the second n-type transistor.

10. The flip-flop of claim 9, wherein the secondary stage comprises:

a third p-type transistor having a gate terminal coupled to the output of the third inverter, wherein a source terminal of the third p-type transistor is coupled to the drain terminal of the second p-type transistor, wherein drain terminals of the third n-type transistor and the third p-type transistor are coupled to an input of the third inverter and the pass-gate.

11. The flip-flop of claim 9, further comprising a fourth inverter coupled to the input of the third inverter and the pass-gate.

12. A system comprising:

a memory;

a processor coupled to the memory, wherein the processor includes a flip-flop which comprises:

a first n-type transistor to receive a data input;

a second n-type transistor coupled in series with the first n-type transistor, wherein the second n-type transistor is controllable by a first clock;

a first p-type transistor to receive the data input, wherein the first p-type transistor is coupled in series to the first n-type transistor; and a second p-type transistor coupled in series to the first p-type transistor, wherein the second p-type transistor is controllable by a second clock, wherein the first clock is an inverse of the second clock, wherein drain terminals of the second n-type transistor and the second p-type transistor are coupled to a secondary stage of the flip-flop, and wherein the secondary stage is coupled to a level sensitive scan design (LSSD) circuitry; and a wireless interface to allow the processor to communicate with another device.

13. The system of claim 12, wherein the flip-flop is a vectored flip-flop.

14. The system of claim 12, wherein the flip-flop includes a scan multiplexer that multiplexes between the data input and a scan input.

15. The system of claim 12, wherein the flip-flop comprises a primary stage which includes:

a first inverter coupled to drain terminals of the first n-type transistor and the first p-type transistor;

a second inverter coupled to the first inverter; and a pass-gate coupled to an output of the second inverter and the drain terminals of the first n-type transistor and the first p-type transistor, wherein the pass-gate is controllable by the first and second clocks.

16. The system of claim 12, wherein the flip-flop further comprises a primary stage that includes:

a first inverter coupled to drain terminals of the first n-type transistor and the first p-type transistor;

a second inverter coupled to the first inverter; and a tristate inverter coupled to an output of the second inverter and the drain terminals of the first n-type transistor and the first p-type transistor, wherein the tristate inverter is controllable by the first and second clocks.

* * * * *